United States Patent [19]

Norsworthy

[11] Patent Number: 5,483,238

[45] Date of Patent: Jan. 9, 1996

[54] DATA CONVERTER WITH GAIN SCALING INCLUDING DITHER

[75] Inventor: Steven R. Norsworthy, Emmaus, Pa.

[73] Assignee: AT&T IPM Corp., Coral Gables, Fla.

[21] Appl. No.: 168,900

[22] Filed: Dec. 16, 1993

[51] Int. Cl.[6] .................................................. H03M 1/20
[52] U.S. Cl. ........................................ 341/131; 341/155
[58] Field of Search .................................. 341/110, 126, 341/131, 139, 141, 143, 155

[56] References Cited

U.S. PATENT DOCUMENTS

| | | | |
|---|---|---|---|
| 4,353,060 | 10/1982 | Endoh et al. | 341/110 |
| 4,366,469 | 12/1982 | Michaels et al. | 341/139 |
| 4,851,841 | 7/1989 | Sooch | 341/143 |
| 5,051,981 | 9/1991 | Kline | 370/32.1 |
| 5,075,678 | 12/1991 | Ohlsson et al. | 341/131 |
| 5,134,399 | 7/1992 | Hiller | 341/131 |
| 5,144,308 | 9/1992 | Norsworthy | 341/131 |
| 5,187,481 | 2/1993 | Hiller | 341/131 |
| 5,250,948 | 10/1993 | Berstein et al. | 341/131 |

FOREIGN PATENT DOCUMENTS

| | | | |
|---|---|---|---|
| 0631395 | 6/1994 | European Pat. Off. | H03M 3/02 |
| 5555-018114 | 4/1980 | Japan | H03K 13/02 |
| 02030 | 4/1990 | Japan | H03M 1/12 |

OTHER PUBLICATIONS

An Audio Engineering Society Preprint Presented at the 95th Convention 1993, Oct. 7–10, New York, "A Single Chip Stereo Audio Codec for PC Multimedia Applications", by Scott McDonald, et al., Crystal Semiconductor Corporation, Austin, Tex., pp. 1–13.

Oversampling Delta–Sigma Data Converters, Theory, Design and Simulation, edited by James C. Candy and Gabor C. Temes, IEEE Press, A Selected Reprint Volume published in 1992, "Oversampling Methods for A/D and D/A Conversion", pp. 1–29.

"Digital Dither: Signal Processing with Resolution Far Below the Least Significant Bit", by Vanderkooy et al., Audio Research Group, University of Waterloo, Waterloo, Canada, AES 7th International Conference, Audio in Digital Times, Toronto, Canada, May 14–17, 1989, pp. 87–96.

"A 16b Oversampling CODEC with Filtering DSP", *IEEE International Solid State Circuits Conference*, vol. 34, Feb. 1991, New York, US, pp. 74–75, Okamoto et al.

*Primary Examiner*—Marc S. Hoff
*Attorney, Agent, or Firm*—David L. Smith

[57] ABSTRACT

A data converter is disclosed that includes a multiplier for multiplying digital signal samples by a gain factor to produce multiplied digital samples. The multiplier can either be bypassed or a dither signal can be introduced in the multiplication operation. A multiplexer responsive to a select input selectively provides either the digital signal samples or the multiplied digital signal samples as the output of the multiplexer.

44 Claims, 4 Drawing Sheets

DATA CONVERTER WITH GAIN SCALING INCLUDING DITHER

TECHNICAL FIELD

This application relates generally to data converters such as encoders or decoders for converting signals from analog form to digital form, or conversely from digital form to analog form, and particularly to such converters including gain scaling.

BACKGROUND OF THE INVENTION

Data converters are used in many applications such as telephone switching equipment, voice-band data communications, speech coding systems, and audio and video signal processing equipment. Data converters have incorporated gain scaling of an incoming analog signal to reduce the output noise of an analog-to-digital converter. In a data converter, signals are converted from one form to another. One of the forms is analog and the other form is digital.

A data converter includes either an analog-to-digital (A/D) converter, a digital-to-analog (D/A) converter, or both. An A/D converter receives an analog signal and provides at its output a digital signal representative of the analog signal. A typical digital signal representation is linear pulse code modulation (PCM). A D/A converter receives a digital signal and provides at its output an analog signal. PCM encoding in data converters results in a one-to-one mapping of analog signal amplitudes to corresponding PCM word values. The analog circuits of data converters have a predetermined amplitude range over which they operate linearly. The predetermined upper and lower bound of this range establishes the analog levels which correspond, respectively, to the maximum and minimum PCM code values for the data converter.

Sigma-delta data converters employ an intermediate step in the conversion process known as sigma-delta modulation, which creates an encoded data stream having a pulse code density proportional to the amplitude of the analog input signal. A sigma-delta A/D converter first converts an analog input into a pulse code density stream, then converts the pulse code density stream into a corresponding PCM word. The pulse code density is proportional to a predetermined maximum and minimum analog input. As the pulse code density approaches a unity value, the signal-to-noise ratio degrades significantly. When this pulse code density stream is converted into PCM words, the PCM words will have a significantly degraded signal-to-noise ratio in the range of its full-scale limit.

Similarly, a sigma-delta D/A converter first converts a series of PCM input words into a pulse code density data stream, then converts the pulse code density stream into a corresponding analog output signal. As the PCM input words approach their maximum levels, the pulse code density of the data stream approaches unity value, resulting in a heavily degraded signal-to-noise ratio. When this pulse code density is converted into an analog output signal, the analog output signal will have a heavily degraded signal-to-noise ratio before it reaches its predetermined full-scale limit.

For full-scale signal magnitudes, a sigma-delta modulator employed as a converter will produce a distorted output necessitating that gain scaling be employed. Gain scaling of digital signals involves multiplication which can produce truncation or rounding bits of lower significance. Another source of distortion is introduced into the signal by the truncation or rounding to reduce word width and results in harmonic distortion of the input signal in the energy spectrum.

A need exists for a technique useful with gain scaling that reduces the distortion introduced by truncation or rounding in gain scaling.

SUMMARY OF THE INVENTION

In accordance with an illustrative embodiment of the invention, a data converter is disclosed that includes a multiplier for multiplying digital signal samples by a gain factor to produce multiplied digital samples. The multiplier can either be bypassed or a dither signal can be introduced in the multiplication operation. A multiplexer responsive to a select input selectively provides either the digital signal samples or the multiplied digital signal samples as the output of the multiplexer.

DETAILED DESCRIPTION

Figure 1:
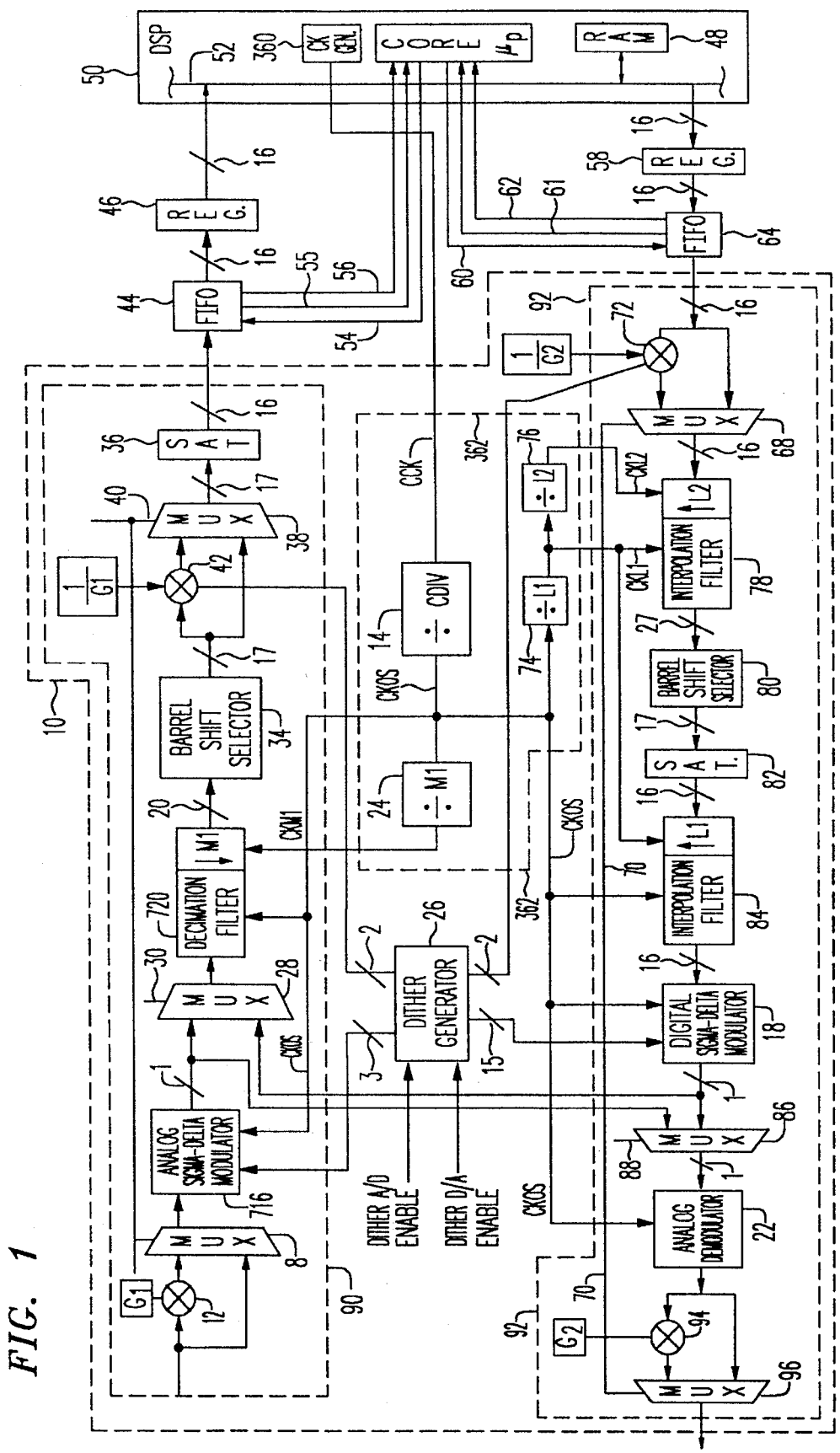
FIG. 1 is a block diagram of a data converter in accordance with an embodiment of the present invention.

An illustrative data converter 10 including gain dither and rounding is shown in FIG. 1. Data converter 10 is shown as having an analog-to-digital (A/D) conversion signal path including coder 90, which is an A/D type data converter. The A/D conversion path includes an analog sigma-delta modulator 716, decimation filter 720, barrel shift selector 34 and saturation circuit 36. The digital-to-analog (D/A) conversion signal path includes decoder 92 which is a D/A type data converter. The digital-to-analog conversion path includes interpolation filter 78, barrel shift selector 80, saturation circuit 82, interpolation filter 84, digital sigma-delta modulator 18 and analog demodulator 22.

Data converter 10 is clocked by incoming clock signal CCK as divided by a programmable divide-by-CDIV clock divider 14 to produce the oversampling clock signal CKOS. Oversampling clock signal CKOS is provided as an input to and is used by analog sigma-delta modulator 716, digital sigma-delta modulator 18, decimation filter 720, interpolation filter 84, and analog demodulator 22. In a preferred embodiment, the sigma-delta modulators are second order. Oversampling clock signal CKOS is also coupled as the input of programmable divide-by-M1 counter 24 and programmable divide-by-L1 counter 74. M 1 is the decimation factor of decimation filter 720. The output of divide-by-M1 counter 24 provides to decimation filter 720 a second clock signal, decimation clock signal CKM, that has a frequency equal to that of the oversampling clock signal CKOS divided by the decimation factor M1. The upstream portion of decimation filter 720 operates at the rate of clock CKOS. The downstream portion operates at the lower, decimated rate of clock CKM. In a illustrative embodiment, decimation filter 720 is a third-order comb filter.

The analog input signal to the A/D conversion signal path 90 provides one input directly to multiplexer 8. The analog input signal multiplied by a programmable gain G1 in multiplier 12 is provided as the other input to multiplexer 8. Multiplexer 8 is responsive to select input 40 to selectively provide one of its analog inputs as its analog output signal.

The analog output signal provided by multiplexer 8 is received by analog sigma-delta modulator 716 as its input. The analog sigma-delta modulator, which may receive dither from dither generator 26, converts the scaled analog input signal into a 1-bit-per-sample first digital data stream. As is known in the art, the 1-bit-per-sample first digital data stream generated by a sigma-delta modulator is converted from a signal represented by zeroes and ones (unsigned data format) to a two-bit-per-sample signal represented by minus ones and plus ones which are consistent with two's complements or sign-magnitude format. Such a representation has a midpoint represented by zero, can take the form of a two's-complement word, and has a sign associated with each value. The output of analog sigma-delta modulator 716 provides an input to multiplexer 28. Multiplexer 28 is responsive to user-determined select input 30 to selectively provide one of its inputs at its output. The output of multiplexer 28 is coupled as the input to decimation filter 720.

Decimation filter 720 filters and decimates the 1-bit-per-sample first digital data stream into a 20-bit-per-sample second digital data stream at the frequency of clock CKM1. The filtering removes out of band energy. In the illustrative embodiment, decimation filter 720 is a third-order comb filter.

Barrel shift selector 34 receives the second digital data stream from the output of decimation filter 720, up to 20 bits per sample, and produces as an output a third digital data stream having 17 bits per sample. The barrel shift selector 34 is programmable and can be varied to select one of four possible bit fields: bits 0–16, 1–17, 2–18, or 3–19.

The 17-bit-per-sample third digital data stream output from barrel shift selector 34 provides the input to saturation circuit 36 through multiplexer 38. The output from barrel shift selector 34 is provided directly as one input to multiplexer 38. The output from barrel shift selector 34 is multiplied by the gain 1/G1 in multiplier 42 as the other input to multiplexer 38. Dither from generator 26 may be added to the gain scaling. Multiplexer 38 is responsive to select input 40 to selectively provide one of its inputs at its output.

Multiplexers 8 and 38 are both responsive to select input 40 such that when the input to multiplexer 8 that is multiplied by gain G1 is selected, the input to multiplexer 38 that is multiplied by gain 1/G1 is selected. Gain scaling employing gain G1 and 1/G1 result in a pulse code modulated output from multiplexer 38 that is full scale, zero dB reference, when the analog input signal to analog sigma-delta modulator 716 is less than full scale. Gain G1 is selected to maintain unity gain. In the manner, the absolute gain of the analog-to-digital signal path (from multiplexer 8 input to multiplexer 38 output) is the same whether gain scaling is employed or not.

Saturation circuit 36 takes the 17-bit-per-sample fourth digital data stream output from multiplexer 38 and reduces each data sample to a 16 bit sample. The output of saturation circuit 36 is a 16-bit-per-sample fifth digital data stream.

The 16-bit-per-sample fifth digital data stream output from saturation circuit 36 is loaded into a first-in-first-out (FIFO) register 44. Register 44 stores several such samples of data. From FIFO 44, the 16 bit samples are temporarily transferred to register 46 prior to being written to random access memory (RAM) 48. Ram 48 is part of digital signal processor (DSP) 50. A DSP is a special purpose microprocessor developed to efficiently perform mathematical operations on real-time digital data. The samples are transferred by way of the internal data bus 52 as controlled by depth flag 54 and interrupt flag 56.

The digital-to-analog conversion signal path converts digital data from RAM 48 of DSP 50 into analog form at the output of analog demodulator 22. Digital data from RAM 48 of DSP 50 for conversion to analog form is written as a 16 bit sample temporarily to register 58. Each 16 bit sample is then transferred to FIFO 64 as controlled by depth flag 60, status flag 61, and interrupt flag 62. The output from FIFO 64 is a 16-bit-per-sample sixth digital data stream. The sixth digital data stream is input to interpolation filter 78 through multiplexer 68. The sixth digital data stream output from FIFO 64 is provided directly as one of the inputs to multiplexer 68. The sixth digital data stream is multiplied by the inverse of gain G2 in multiplier 72 as the other input to multiplexer 68. Multiplexer 68 is responsive to a select input 70 to selectively provide one of its inputs as its output. The output of multiplexer 68 is a seventh digital data stream.

The seventh digital data stream is provided as the input to interpolation filter 78. Interpolation filter 78 receives clocks CKL1 and CKL2. Clock CKL1 is clock CKOS divided by interpolation factor L1. Clock CLK2 is clock CLK1 divided by interpolation factor L2. The output from interpolation filter 78 is a 27-bit-per-sample eighth digital data stream. Interpolation filter 78, in a illustrative embodiment, is a third-order comb filter that removes out-of-band energy and produces the eighth digital data stream at a frequency of the over sampling frequency as divided by L1. The upstream portion of interpolation filter 78 operates at the lower clock rate CLK2. The downstream portion operates at the higher clock rate CLK1.

The eighth digital data stream provides the input to barrel shift selector 80. Barrel shift selector 80 receives the 27-bit-per-sample eighth digital data stream from the output of interpolation filter 78 and selects a field of 17 bits per sample to provide as its output, a ninth digital data stream. The field of barrel shift selector 80 is programmable. In the exemplary embodiment there are eleven possible seventeen bit fields. In a illustrative embodiment, the field of barrel shift selector 80 is programmed to select one of the top seven bit fields: 4–20; 5–21; 6–22; 7–23 through 10–26.

Saturation circuit 82 receives the 17-bit-per-sample ninth digital data stream output from barrel shift selector 80 and reduces each sample to 16 bits to provide a tenth digital data stream substantially in the same manner as saturation circuit 36.

Interpolation filter 84 receives the tenth digital data stream and operates at the oversampling clock rate, as divided by programmable divide by L1. The upstream portion of interpolation filter 84 operates at the lower clock rate CKL1. The downstream portion operates at the higher clock rate CKOS. Interpolation filter 84, in a illustrative embodiment is a first-order comb filter that removes out of band energy and produces an eleventh digital data stream as an output.

The eleventh digital data stream output of interpolation filter 84 is coupled as the input to digital sigma-delta modulator 18. Digital sigma-delta modulator 18 in a illustrative embodiment is second order. Modulator 18 may receive dither from dither generator 26 and converts the 16-bit-per-sample data into a 1-bit-per-sample twelfth digital data stream.

The output of digital sigma delta modulator 18 provides an input to multiplexer 86. Multiplexer 86 is responsive to select input 88 to selectively provide one of the inputs at its output. The multiplexer output is a 1-bit-per-sample thirteenth digital data stream.

Analog demodulator 22 is a 1-bit sample and hold converter which converts the 1-bit-per-sample thirteenth digital data stream received from multiplexer 86 into a step wise continuous analog output signal. Analog demodulator 22 includes one or more analog filters as known in the art to smooth the analog output signal. The analog output signal from analog demodulator 22 is provided directly as one of the inputs to multiplexer 96 and is multiplied by gain G2 in multiplier 94 to provide the other input to multiplexer 96. Gain G2 may be achieved in any known manner. Multiplexer 96 is responsive to select input 70 to selectively provide one of its inputs as its output. The output of multiplexer 96 is an analog signal. Multiplexers 68 and 96 are both responsive to select input 70 such that when the input to multiplexer 68 that is multiplied by gain 1/G2 is selected, the input to multiplexer 96 that is multiplied by gain G2 is selected. Gain G2 is selected to maintain unity gain. In this manner, the absolute gain of the digital-to-analog signal path (from multiplexer 68 input to multiplexer 96 output) is the same whether or not gain scaling is employed. While multiplier 94 and multiplexer 96 are shown downstream from analog demodulator 22, they could be embedded at the input or within the analog demodulator.

The pulse code modulated digital data stream at the output of decimation filter 720 or barrel shift selector 34 has a pulse code density that is proportional to the analog signal input to analog sigma-delta modulator 716. When the analog input signal approaches a predetermined positive magnitude, the pulse code density approaches all ones (for a predetermined negative magnitude, all minus ones). At a predetermined pulse code density less than all ones, the signal-to-noise ratio (SNR) reaches a maximum that is its optimum. This predetermined pulse code density has a corresponding analog input level at the input of analog sigma-delta modulator 716. Analog input magnitudes greater than the above stated corresponding analog input level will produce a pulse code density magnitude that continues to approach all ones while the SNR degrades as shown in FIG. 2.

Figure 2:
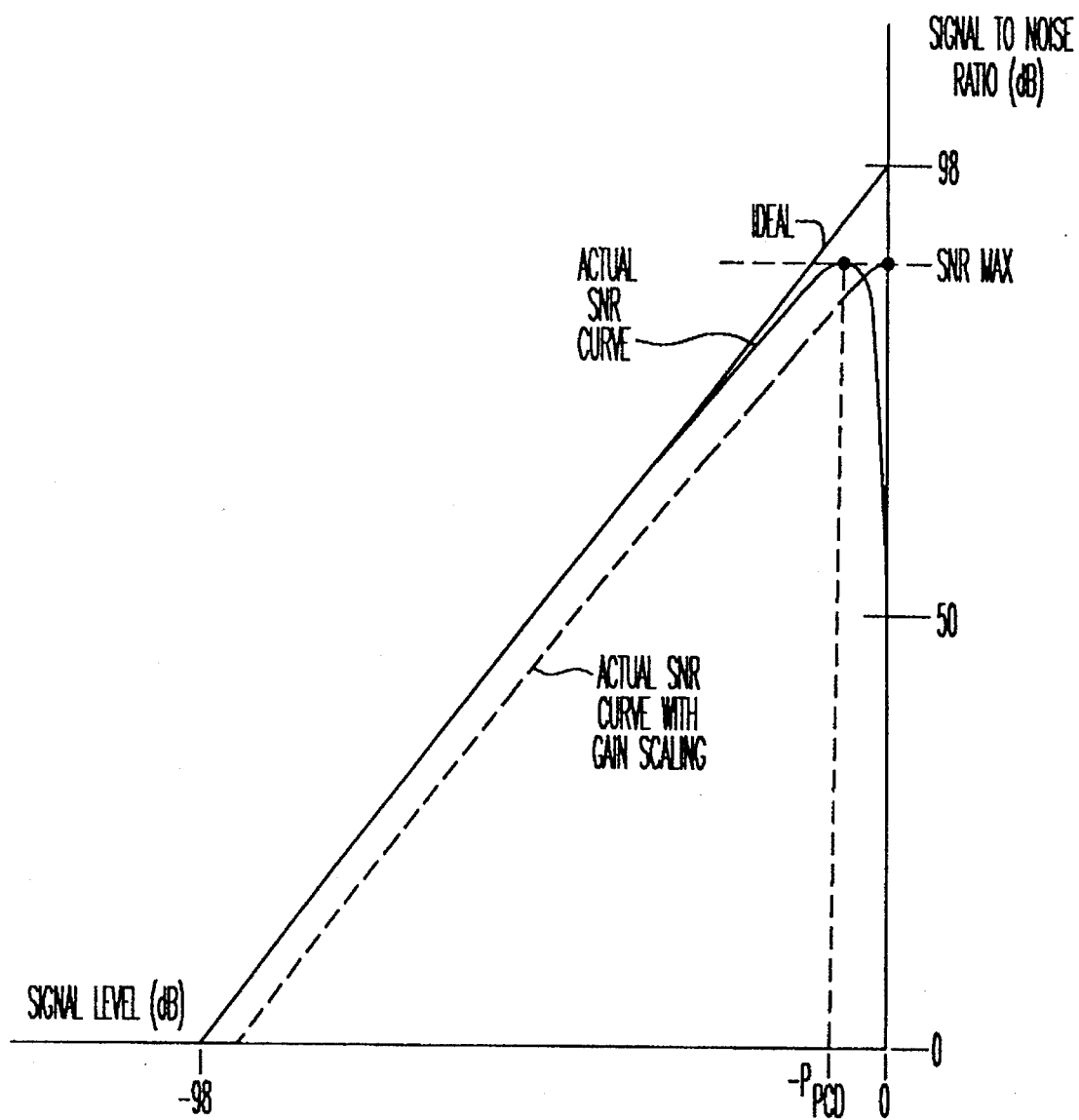
FIG. 2 is a graph of signal-to-noise ratio as a function of signal level.

The curve shown in FIG. 2 is determined empirically. The actual signal-to-noise ratio curve is graphed. A line having the average slope of the curve is drawn through the lower signal level range and extended to intersect the vertical axis. This provides an ideal, linear signal-to-noise ratio as a function of signal level.

At the maximum signal-to-noise ratio, the slope of the curve is zero. The pulse code density expressed as a fraction, at the maximum signal-to-noise ratio, is $P_{PCD}$. It is desirable to gain scale coder 90 and decoder 92 such that the full-scale PCM output occurs at a point on the SNR curve where the SNR is at or near maximum. When gain scaling employing gains 1/G1 and 1/G2, $P_{PCD}$ is full scale PCM. This is shown in the dashed curve of FIG. 2 where the maximum point on the SNR curve corresponds to full-scale PCM. For a second-order sigma-delta modulator, the maximum occurs when the $P_{PCD}$ has a magnitude of about eight-tenths, corresponding to about minus two decibels. For higher-order sigma-delta modulators, the maximum occurs at a lower pulse code density, corresponding to about minus five decibels, depending on the characteristics of the modulator. In coder 90, the gain factor at the maximum SNR (designated 1/G1) used in the multiplication of multiplier 42 has a magnitude that is the inverse of $P_{PCD}$. Since $P_{PCD}$ in the illustrative embodiment is about 0.8, the gain factor is 1.25. In this manner, when analog sigma-delta modulator 716 produces a digital data stream having a pulse code density of 0.8, the multiplier multiplies the digital data stream by 1/G1 to increase the pulse code density such that the normalized pulse code density of the digital data stream at the output of multiplier 42 is the largest magnitude this PCM word can contain. This gain scaling takes advantage of the full-scale dynamic range, while preventing loss of information through overloading. Gain 1/G1 in multiplier 42 corresponds to the optimal pulse code density at the output of analog sigma-delta modulator 716 to achieve the best signal-to-noise ratio. While gains other than 1/G1 will operate in multiplier 42, such gains will not be optimal. This relationship between the pulse code density and the multiplier gain is desired whether or not the gain is dithered or rounded. Saturation circuit 36 prevents arithmetic wraparound effects from occurring for greater input magnitudes than the value that produces the largest magnitude the PCM word can contain, but introduces clipping distortion. While the preferred embodiment discloses an optimum SNR that is also the maximum SNR, it may be desirable in some applications to select as optimum a SNR that is not maximum, but is near maximum. Such an optimum SNR would typically be at a slightly higher pulse code density than the maximum SNR. This would permit having a SNR only slightly less than maximum while extending the dynamic range.

Dithering can be used independently of rounding. Once dither is introduced, a decision must be made whether to round or truncate. Independent of dithering, the distortion characteristics due to truncation are generally less desirable than those due to rounding. A wide range of gains may utilize dither and truncation, or dither and rounding. Dithering, which is known in the art, may have any known probability density function such as triangular or rectangular probability density function and typically has a zero mean. From a statistical perspective, dither having a triangular probability density function spanning two least significant bits is better than dither having a rectangular probability density function spanning one least significant bit because the second moment of the correlation is nearly zero. Rectangular probability density function dither may be employed in many applications with acceptable results. In the illustrative embodiment, the dither can be enabled or disabled.

Figure 3:
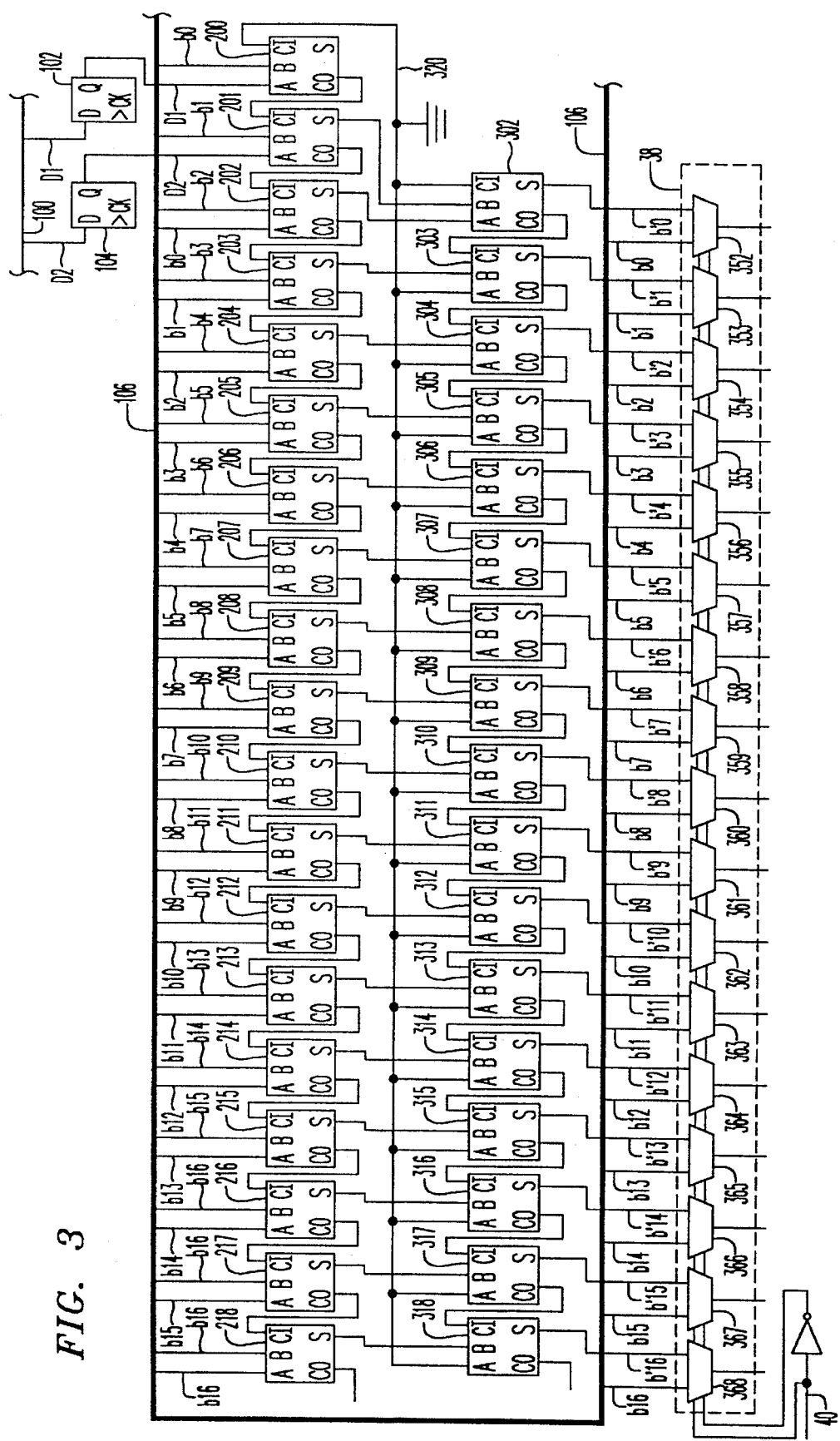
FIG. 3 is a schematic diagram showing dither and rounding in a data converter gain of greater than unity.

FIG. 3 is a schematic diagram of an embodiment of the invention implementing dither and rounding in a gain stage greater than unity. Consider multiplier 42 where it is desired to dither and round a 17-bit word into a 16-bit word. As a numerical example, consider a gain 1/G1 that is 5/4. Dither and rounding are achieved by taking the 17 bits, adding two bits with dither, then through the carry operation when truncated to be 16 bits in length, results in a 16-bit word that has been dithered and rounded.

Two dither bits D1 and D2 are received from dither generator 26 on bus 100. Typically, dither bits D1 and D2 are latched respectively into latches 102 and 104. The dither bits are pseudorandom and take on the values of either logic 1 or logic 0. The dither bits may be generated by a p-n sequence generator, also known as a shift register sequence generator, as taught in *Shift Register Sequences* by S. W. Golomb.

Recognizing that 5/4 is equivalent to 4/4+1/4 and that multiplying by four is equivalent to a 2-bit left shift, a gain of 5/4 with dither and rounding can be constructed as shown in FIG. 3. The 17-bit word is provided as the B input to a series of adders. A shifted version of the 17-bit word is provided as the A input to the series of adders. The 17 bits, b0–b16, of a word received from barrel shift selector 34 are received on bus 106 and provided as the input respectively to the B input of 1-bit full adders 200–216. Bit b16 is also provided as the B input to 1-bit full adders 217 and 218 as a sign extension. The dither bits D1 and D2 are provided as the A input to adders 200 and 201. The A input of adders 202–218 are bits b0–b16, hence, their position is effectively shifted left by two bits. The carry output of each adder 200–217 is coupled to and provides the carry input to the next higher-numbered adder. The carry output of adder 218 is disregarded.

The summed output of each adder 202 through 218, respectively, provides one of the inputs to each of adders 302–318. The second input to each of adders 303–318 is a logic zero due to being coupled to ground bus 320. Adders 302–318 are shown as full adders, but half adders would suffice. The carry output of each adder 302–317 is coupled to and provides the carry input to the next higher-numbered adder. The carry output of adder 318 is disregarded. The second input to adder 302 is the sum output of adder 201. This input to adder 302 from the sum output of adder 201 when added to the sum output of adder 202 provides rounding of the least significant bit. In adders 200–218, the binary point is between the two adders, 201 and 202, the sum outputs of which provide two inputs to adder 302. Thus, the binary point is to the left of the adders to which dither is added. The sum output of adder 302 is the least significant bit of the rounded result, with the binary point to the right of the sum output of adder 302. The other more significant bits are produced by rippling the carry output of adder 302 through adders 303–318. The sum output of adder 200 is disregarded.

Multiplexers 352 through 368 each receive two inputs. As seen in FIG. 3, one of the inputs is from bus 106 and the other input is the corresponding bit of a word that has been multiplied by 1/G1, dithered, and rounded. Each of multiplexers 352 through 368 receives the second input from the sum output of adders 302 through 318, respectively. As stated above, the gain with dither and rounding can be introduced or bypassed, as determined by select input 40 of multiplexer 38. Collectively, multiplexers 352 through 368 comprise multiplexer 38. Each of multiplexers 352 through 368 is responsive to select input 40 to selectively provide one of the inputs at its output. The 17-bit output, either b'16–b'0 or b16–b0, is taken from the output of multiplexers 368–352.

Dither and rounding in gain scaling provides the advantages of whitening the energy spectrum and resolving signals below the least significant bit. While the above example discloses dithering in combination with rounding, dithering can be employed independently of rounding. Once dither is introduced, a choice is made whether to round or truncate the least significant bit(s). Dithering in gain scaling reduces the magnitude of the harmonic distortion components in the energy spectrum due to truncation or rounding to be within the noise, typically more than 100 dB below the full scale signal level for 16-bit words.

Figure 4:
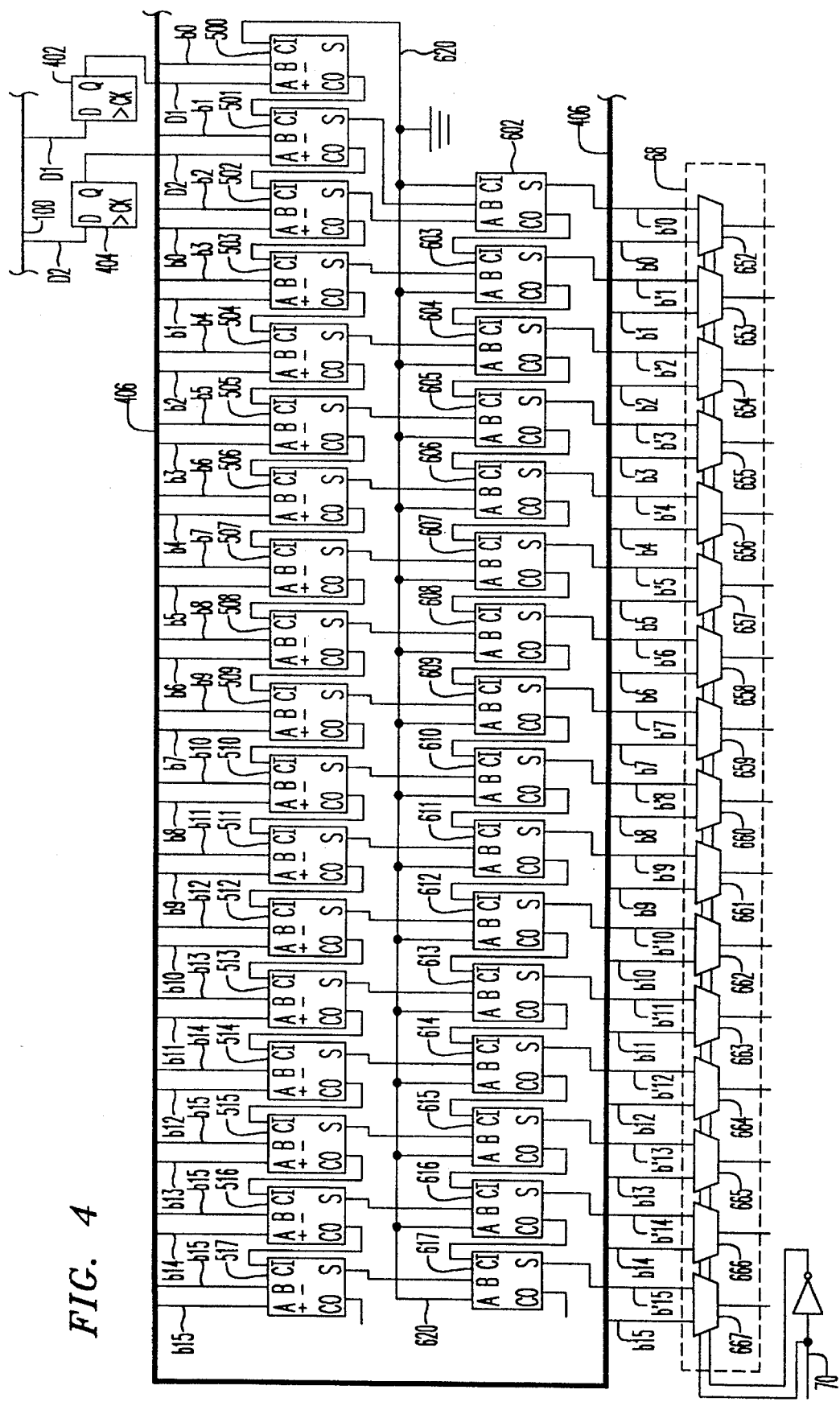
FIG. 4 is a schematic diagram showing dither and rounding in a data converter gain of less than unity.

Gain scaling is also incorporated in the digital-to-analog signal path 92. A gain stage incorporating dithering and rounding having a gain of less than unity is shown in FIG. 4. Ideally, gain 1/G2 would be identical to gain 1/G1 in the illustrative embodiment since the coder and decoder both include a second-order sigma-delta modulator. The gain shown is ¾ which is typical of the magnitude of the gain introduced in multiplier 72. A gain of ¾ was used for convenience of implementation, sacrificing some dynamic range, about 0.56 dB. This results in the decoder operating at a SNR slightly less than the maximum point. Multiplier 72 receives a 16-bit word, dithers and rounds the 16-bit word producing a 16-bit word at its output. Two dither bits D1 and D2 are received from dither generator 26 on bus 100 and are latched respectively into latches 402 and 404. As stated above, the dither bits are either logic 1 or logic 0, and pseudorandom.

Recognizing that ¾ is equivalent to 4/4 minus ¼ and that multiplying by four is equivalent to a two-bit left shift, a gain of ¾ with dither and rounding can be constructed as shown in FIG. 4. A shifted version of the 16-bit word received from first-in-first-out register 64 is provided as the A input to the series of full adders. The 16-bit word received from first-in-first-out register 64 is provided as the B input to the series of full adders. The dither bits D1 and D2 are provided as the A input to adders 500 and 501. The A inputs of adders 502–517 are bits b0–b15, hence, their position is effectively shifted left by two bits. The sixteen bits, b0–b15, of a word received from first-in-first-out register 64 are received on bus 406 and provided as the input respectively, to the B input of one-bit full subtractors 500–515. Bit b15 is also provided as the B input to one bit full adders 516 and 517 as a sign extension. The B input to each adder is subtracted from the A input. The carry output of each adder 500–516 is coupled to and provides the carry input to the next higher-numbered adder. The carry output from adder 517 is disregarded. The carry input to adder 500 is zero by connection to ground.

The summed output of each adder 502 through 517 respectively provides one of the inputs to each of adders 602 through 617. The second input to each of adder 603 through 617 is a logic zero due to being coupled to ground bus 620. Adders 602 through 617 are shown as full adders, but half adders will suffice. The carry output of each adder 602–616 is coupled to and provides the carry input to the next higher-numbered adder. The carry output of adder 617 is disregarded. The second input to adder 602 is the summed output of adder 501. This input to adder 602 from the sum of output of adder 501, when added to the sum output of adder 502 provides rounding of the least significant bit. In adders 500–517, the binary point is between the two adders, 501 and 502, the sum outputs of which provide two inputs to adder 602. Thus, the binary point is to the left of the adders to which dither is added. The sum output of adder 602 is the least significant bit of the rounded result, with the binary point positioned to the right of the sum output of adder 602. The other more significant bits are produced by rippling the carry output of adder 602 through adders 603–617. The sum output of adder 500 is disregarded.

Multiplexers 652 through 667 each receive two inputs. As seen in FIG. 4, one of the inputs is from bus 406 and the other input is the corresponding bit of a word that has been multiplied by 1/G2, dithered, and rounded. Each of multiplexers 652 through 667 receives the second input from the sum output of adders 602 through 617, respectively. As stated above, the gain with dither and rounding can be introduced or bypassed, as determined by select input 70 of multiplexer 68. Collectively, multiplexers 652 through 657 comprise multiplexer 68. Each of multiplexers 652 through 667 is responsive to select input 70 to selectively provide one of the inputs at its output. The 16-bit output, either b'15–b'0 or b15–b0, is taken from the output of multiplexers 667–652.

FIG. 2 also applies to the digital-to-analog conversion signal path since digital sigma-delta modulator 18 is also second order. The attenuation introduced by gain 1/G2 assures that the pulse-code-modulated digital data stream at the output of digital sigma-delta modulator 18 never reaches all ones. Gain G2, while not optimum, takes advantage of the division by four being a two-bit shift. The pulse code density at the input to digital sigma-delta modulator 18 is limited so as not to exceed G2 by multiplying the input to multiplier 72 by a gain 1/G2.

While one form of multiplication has been described above, multiplication can be effectively achieved in many ways. Multiplication can effectively be achieved in software in a bit shift operation, introducing a gain in a filter, or a hardware filter. The gain and dither could be achieved within the DSP.

Gain scaling has been introduced in the D/A path at the lowest sample rate: However, the invention is not limited thereto. Gain scaling could be introduced at any point along the D/A path prior to digital sigma-delta modulator. An advantage of introducing gain scaling at the higher data rate immediately before digital sigma-delta modulator 18 is that the noise added by the dither is spread over a wider frequency spectrum and therefore the in-band noise is lower. To implement gain scaling at the higher rate requires more complex circuitry, however.

Analog sigma-delta modulator 716, decimation filter 720, digital sigma-delta modulator 18, interpolation filter 78, and interpolation filter 84 are or contain filters. While the order of these filters has been indicated for the illustrative embodiment, invention is not limited to the orders indicated.

Although gains G1 rand 1/G1, as well as gains G2 and 1/G2, have been illustrated to reflect a unit gain in the analog-to-digital and digital-to-analog signal paths, respectively, a unit gain is not necessary. Preferably the gain before the sigma-delta modulator in a signal path should be less than unity.

The invention is not limited to the numerical values used to disclose the illustrative embodiment. The bit-width output from various elements, the order of the various filters, the ranges for the interpolation and decimation factors and the output fields and ranges for the barrel shift selector and the number of bits of saturation, and the like, are exemplary in the illustrated embodiment.

While illustrative embodiment of the invention has not been described as incorporating pipelining or paralleling to reduce latency times, one skilled in the art would recognize the enhanced computational efficiency available by utilizing such techniques.

I claim:

1. Apparatus for converting a signal from one form to another, comprising:

a converter for converting signals from one form to another, one of the forms being analog and the other form being digital, the converter having an analog side and a digital sample side;

a multiplier for multiplying digital signal samples on the digital sample side of the converter by a gain factor to produce multiplied digital signal samples; and a multiplexer having a first input to receive the digital signal samples as a first input signal and a second input to receive the multiplied digital signal samples as a second input signal, the multiplexer being responsive to a select input for selectively providing one of the input signals as an output of the multiplexer, whereby when the first input signal is selected as the output of the multiplexer, the multiplier is bypassed, and when the second input signal is selected as the output of the multiplexer, the multiplier is operational to multiply the digital signal samples by the gain factor.

2. Apparatus as recited in claim 1, wherein the converter is an analog-to-digital converter and the digital form of the signal comprises the digital signal samples.

3. Apparatus as recited in claim 1, wherein the converter is a digital-to-analog converter and the digital form of the signal is the multiplied digital signal samples.

4. Apparatus as recited in claim 1, wherein the converter comprises a sigma-delta modulator.

5. Apparatus recited in claim 1, wherein the gain factor has a magnitude such that the digital signal samples have an optimum signal-to-noise ratio.

6. Apparatus as recited in claim 1, further comprising:

a second multiplier, the second multiplier for receiving an analog signal and for multiplying the analog signal by a second gain factor to produce a multiplied analog signal; and a second multiplexer, the second multiplexer on the analog side of the converter, the second multiplexer having a first input to receive the analog signal as a first input signal and a second input to receive the multiplied analog signal as a second input signal, the second multiplexer being responsive to a select input for selectively providing one of the input signals as an output of the second multiplexer, whereby when the first input signal is selected as the output of the second multiplexer, the second multiplier is bypassed, and when the second input signal is selected as the output of the second multiplexer, the second multiplier is operational to multiply the analog signal by the second gain factor.

7. Apparatus as recited in claim 6, wherein the product of the gain factor of the multiplier and the second gain factor of the second multiplier is unity.

8. Apparatus as recited in claim 1, further comprising a dither generator for introducing dither into the multiplier.

9. Apparatus as recited in claim 8, wherein the dither generator generates dither having a rectangular probability density function.

10. Apparatus as recited in claim 8, wherein the dither generator generates dither having a triangular probability density function.

11. Apparatus as recited in claim 8, wherein the digital signal samples comprise a multiple bit word, and wherein the multiplier comprises a first plurality of adders, each of the first plurality of adders having first and second inputs, the first input of each of the first plurality of adders receiving a bit of a multiple bit word, the second input of at least one of the first plurality of adders receiving dither from the dither generator.

12. Apparatus as recited in claim 11, wherein the second input of each of the first plurality of adders that does not receive a bit of a shifted version of the multiple-bit word, receives dither from the dither generator.

13. Apparatus as recited in claim 11, wherein each of the first plurality of adders further comprises a sum output, the data converter further comprising a second plurality of adders, at least one adder of the second plurality of adders having first and second inputs, said at least one adder of the second plurality of adders receiving at its first input the sum output from one of the adders of the first plurality of adders and receiving at its second input the sum output from another one of the adders of the first plurality of adders.

14. Apparatus as recited in claim 13, wherein the adders from the first plurality of adders that are coupled to the first and second inputs of said at least one adder of the second plurality of adders are adjacent to a binary point.

15. Apparatus as recited in claim 13, further comprising the sum output of at least one adder of the first plurality of adders is not coupled to either a first or second input of any of the adders of the second plurality of adders.

16. Apparatus as recited in claim 11, wherein the second input of a plurality of the first plurality of adders each receive a bit of a bit-shifted version of the multiple bit word.

17. Apparatus as recited in claim 16, wherein the gain factor is expressible as a quotient having a denominator, the denominator being a power of two.

18. Apparatus as recited in claim 17, wherein the power of two corresponds to the number of bits the multiple-bit word is shifted to generate the bit-shifted version of the multiple-bit word.

19. Apparatus comprising:

a converter for converting a signal from one form to another, one of the forms being analog and the other form being digital, the converter having an analog side and a digital sample side;

a dither generator for generating a dither signal; and a multiplier for receiving digital signal samples from the digital sample side of the converter and for receiving the dither signal, the multiplier for multiplying the digital signal samples by a gain factor and for introducing the dither signal to produce a multiplied digital signal.

20. Apparatus as recited in claim 19, wherein the converter is an analog-to-digital converter and the digital form of the signal comprises the digital signal samples.

21. Apparatus as recited in claim 19, wherein the converter is a digital-to-analog converter and the digital form of the signal is the multiplied digital signal samples.

22. Apparatus as recited in claim 19, wherein the converter comprises a sigma-delta modulator.

23. Apparatus as recited in claim 19, wherein the dither generator generates dither having a rectangular probability density function.

24. Apparatus as recited in claim 19, wherein the dither generator generates dither having a triangular probability density function.

25. Apparatus as recited in claim 19, wherein the gain factor has a magnitude such that the digital signal samples have an optimum signal-to-noise ratio.

26. Apparatus as recited in claim 19, further comprising:

a second multiplier, the second multiplier for receiving an analog signal and for multiplying the analog signal by a second gain factor to produce a multiplied analog signal; and a multiplexer, the multiplexer on the analog side of the converter, the multiplexer having a first input to receive the analog signal as a first input signal and a second input to receive the multiplied analog signal as a second input signal, the multiplexer being responsive to a select input for selectively providing one of the input signals as an output of the multiplexer, whereby when the first input signal is selected as the output of the second multiplier, the second multiplier is bypassed and when the second input signal is selected as the output of the second multiplier, the second multiplier is operational to multiply the analog signal by the second gain factor.

27. Apparatus as recited in claim 26, wherein the product of the gain factor of the multiplier and the second gain factor of the second multiplier is unity.

28. Apparatus as recited in claim 19, wherein the digital signal samples comprise a multiple bit word, and wherein the multiplier comprises a plurality of first adders, each of said plurality of first adders having first and second inputs, the first input of each of the first plurality of adders receiving a bit of a multiple bit word, the second input of at least one of the first plurality of adders receiving dither from the dither generator.

29. Apparatus as recited in claim 28, wherein the second input of each of the first plurality of adders that does not receive a bit of a shifted version of the multiple bit word, receives dither from the dither generator.

30. Apparatus as recited in claim 28, wherein each of the first plurality of adders further comprises a sum output, the data converter further comprising a second plurality of adders, at least one adder of the second plurality of adders having first and second inputs, the at least one adder of the second plurality of adders receiving at its first input the sum output from one of the adders of the first plurality of adders and receiving at its second input the sum output from another one of the adders of the first plurality of adders.

31. Apparatus as recited in claim 30, wherein the adders of the first plurality of adders that are coupled to the first and second inputs of said at least one adder of the second plurality of adders are adjacent to a binary point.

32. Apparatus as recited in claim 30, further comprising the sum output of at least one adder of the first plurality of adders is not coupled to either a first or second input of any of the adders of the second plurality of adders.

33. Apparatus as recited in claim 28, wherein the second input of a plurality of the first plurality of adders each receive a bit of a bit shifted version of the multiple bit word.

34. Apparatus as recited in claim 33, wherein the gain factor is expressible as a quotient having a denominator, the denominator being a power of two.

35. Apparatus as recited in claim 34, wherein the power of two corresponds to the number of bits the multiple bit word is shifted to generate the bit shifted version of the multiple bit word.

36. Apparatus, comprising:

an analog-to-digital converter for convening an incoming analog signal into first digital signal samples;

a first multiplier for multiplying the first digital signal samples by a first gain factor to produce first multiplied digital signal samples;

a first multiplexer having a first input to receive the first digital signal samples as a first input signal and a second input to receive the first multiplied digital signal samples as a second input signal, the first multiplexer being responsive to a first select input to selectively provide one of the input signals as an output of the first multiplexer;

a second multipier for receiving second digital signal samples and for multiplying the second digital signal samples by a second gain factor to produce second multiplied digital signal samples;

a second multiplexer having a first input to receive the second digital signal samples as a first input signal and a second input to receive the second multiplied digital signal samples as a second input signal, the second multiplexer being responsive to a second select input to selectively provide one of the input signals as an output of the second multiplexer; and a digital-to-analog converter for converting the output from the multiplexer into an analog signal.

37. Apparatus as recited in claims 36, wherein the analog-to-digital converter comprises a sigma-delta modulator.

38. Apparatus as recited in claim 36, wherein the digital-to-analog converter comprises a sigma-delta modulator.

39. Apparatus as recited in claim 36, further comprising a dither generator, the dither generator producing a dither signal for introduction into the first multiplier.

40. Apparatus as recited in claim 36, further comprising a dither generator, the dither generator producing a dither signal for introduction into the second multiplier.

41. Apparatus, comprising:

an analog-to-digital converter for converting an incoming analog signal into first digital signal samples;

a first multiplier for multiplying the first digital signal samples by a first gain factor to produce first multiplied digital signal samples;

a second multiplier for receiving second digital signal samples and for multiplying the second digital signal samples by a second gain factor to produce second multiplied digital signal samples;

a digital-to-analog converter for converting the second multiplied digital signal samples into an analog signal; and a dither generator for producing a dither signal, the dither signal for introduction into one of the first or second multipliers.

42. Apparatus as recited in claim 41, wherein the dither signal is introduced into the first multiplier.

43. Apparatus as recited in claim 41, wherein the dither signal is introduced into the second multiplier.

44. A method of converting a signal from one form to another, one form being digital and the other form being digital, comprising the steps of:

generating a dither signal;

multiplying a digital signal by a gain factor resulting in a multiplied digital signal;

introducing dither into the multiplication operation;

selecting either the digital signal or the multiplied digital signal as an output; and converting a signal from one form to another form, one of the forms being digital and the other form being analog, whereby when an analog-to-digital converter is employed, the digital form of the signal is the digital signal, and when the digital-to-analog converter is employed, the digital form of the signal is the multiplied digital signal.

* * * * *